(12) United States Patent
Chen

(10) Patent No.: US 12,407,299 B2
(45) Date of Patent: Sep. 2, 2025

(54) FREQUENCY MIXER AND TRANSCEIVER

(71) Applicant: SANECHIPS TECHNOLOGY CO., LTD., Guangdong (CN)

(72) Inventor: Zhilin Chen, Guangdong (CN)

(73) Assignee: SANECHIPS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/564,116

(22) PCT Filed: Mar. 21, 2022

(86) PCT No.: PCT/CN2022/081928
§ 371 (c)(1),
(2) Date: Nov. 27, 2023

(87) PCT Pub. No.: WO2022/247410
PCT Pub. Date: Dec. 1, 2022

(65) Prior Publication Data
US 2024/0250641 A1    Jul. 25, 2024

(30) Foreign Application Priority Data

May 28, 2021 (CN) .......................... 202110591105.9

(51) Int. Cl.
*H03D 7/14* (2006.01)
(52) U.S. Cl.
CPC ......... *H03D 7/1458* (2013.01); *H03D 7/1441* (2013.01)
(58) Field of Classification Search
CPC ...... H03D 7/1441; H03D 7/1425; H03D 7/00; H03D 7/1458; H03D 7/1466; H03D 7/1483; H03D 7/1491
See application file for complete search history.

(56) References Cited

U.S. PATENT DOCUMENTS 7,299,025 B1    11/2007  Wong
10,581,381 B2 *  3/2020  Krishnamurthi ..... H03D 7/1425
(Continued)

FOREIGN PATENT DOCUMENTS

CN    102522954 B    10/2014
CN    104935264 A     9/2015
(Continued)

OTHER PUBLICATIONS

WIPO, International Search Report issued on May 30, 2022.
(Continued)

*Primary Examiner* — Diana J. Cheng
(74) *Attorney, Agent, or Firm* — Li & Cai Intellectual Property (USA) Office

(57) ABSTRACT

Provided are a frequency mixer, including: a transconductance circuit connected to an input signal terminal, and configured to generate a differential signal according to an input signal from the input signal terminal and output the differential signal through first and second output terminals of the transconductance circuit; a switch circuit connected to a local oscillator signal terminal and the first and second output terminals of the transconductance circuit, and configured to perform frequency mixing on a local oscillator signal from the local oscillator signal terminal and the differential signal to generate a mixed signal and output the mixed signal through first and second output terminals of the switch circuit; a load circuit connected to an output signal terminal and configured to provide a load; and an amplification circuit connected between the switch circuit and the load circuit and configured to amplify the mixed signal. A transceiver is also provided.

19 Claims, 6 Drawing Sheets

(56) References Cited

U.S. PATENT DOCUMENTS

| | | | |
|---|---|---|---|
| 11,431,358 B2* | 8/2022 | Park | H03D 7/1483 |
| 2012/0200334 A1 | 8/2012 | Connell | |
| 2020/0228062 A1 | 7/2020 | Kim | |

FOREIGN PATENT DOCUMENTS

| | | |
|---|---|---|
| CN | 104158496 B | 2/2017 |
| CN | 107896093 A | 4/2018 |
| CN | 110445468 A | 11/2019 |
| CN | 110677128 A | 1/2020 |
| CN | 113472295 A | 10/2021 |
| JP | S 577489 A | 2/1982 |
| JP | H 09121124 A | 5/1997 |
| JP | 2008131566 A | 6/2008 |
| JP | 2015100078 A | 5/2015 |

OTHER PUBLICATIONS

Laleh Rabieirad and Saeed Mohammadi. "A dual-mode programmable distributed amplifier/mixer," Purdue University, Purdue e-Pubs, Department of Electrical and Computer Engineering Faculty Publications, Jan. 31, 2009.

Japan Patent Office, First Office Action dated Oct. 1, 2024, for corresponding JP application No. 2023-573310.

Korea Patent Office, First Office Action dated Feb. 18, 2025, for corresponding KR application No. 10-2023-7040501.

European Patent Office, the Extended European Search Report dated May 7, 2025, for corresponding EP application No. 22810144.0.

Kao H-L et al: "67-80 GHz double-balanced Gilbert-cell mixer in 0.1 μm GaAs pHEMT technology", Electronics Letters, the Institute of Engineering and Technology, GB, Feb. 18, 2016, vol. 52, No. 4.

* cited by examiner

FREQUENCY MIXER AND TRANSCEIVER

CROSS REFERENCE TO RELATED APPLICATIONS

The present disclosure is a National Phase Application filed under 35 U.S.C. 371 as a national stage of PCT/CN2022/081928, filed on Mar. 21, 2022, an application claiming the priority to Chinese Patent Application No. 202110591105.9 filed with the CNIPA on May 28, 2021, the contents of which are incorporated herein by reference in their entirety.

TECHNICAL FIELD

The present disclosure relates to, but is not limited to, the technical field of frequency mixers.

BACKGROUND

With the development of mobile communication technology (such as the fifth-generation mobile communication technology (5G)), higher requirements are proposed on rate, latency and reliability of information transmission, and beam forming and Massive Multiple-Input Multiple-Output (Massive MIMO) are two important techniques for meeting the requirements.

SUMMARY

The present disclosure provides a frequency mixer and a transceiver.

In a first aspect, the present disclosure provides a frequency mixer, including: a transconductance circuit connected to an input signal terminal, and configured to generate a differential signal according to an input signal from the input signal terminal and output the differential signal through a first output terminal and a second output terminal of the transconductance circuit; a switch circuit connected to a local oscillator signal terminal and the first output terminal and the second output terminal of the transconductance circuit, and configured to perform frequency mixing on a local oscillator signal from the local oscillator signal terminal and the differential signal to generate a mixed signal and output the mixed signal through a first output terminal and a second output terminal of the switch circuit; a load circuit connected to an output signal terminal and configured to provide a load; and an amplification circuit connected between the switch circuit and the load circuit and configured to amplify the mixed signal.

In a second aspect, the present disclosure provides a transceiver, including: the above-described frequency mixer.

DETAIL DESCRIPTION OF EMBODIMENTS

Figure 1:
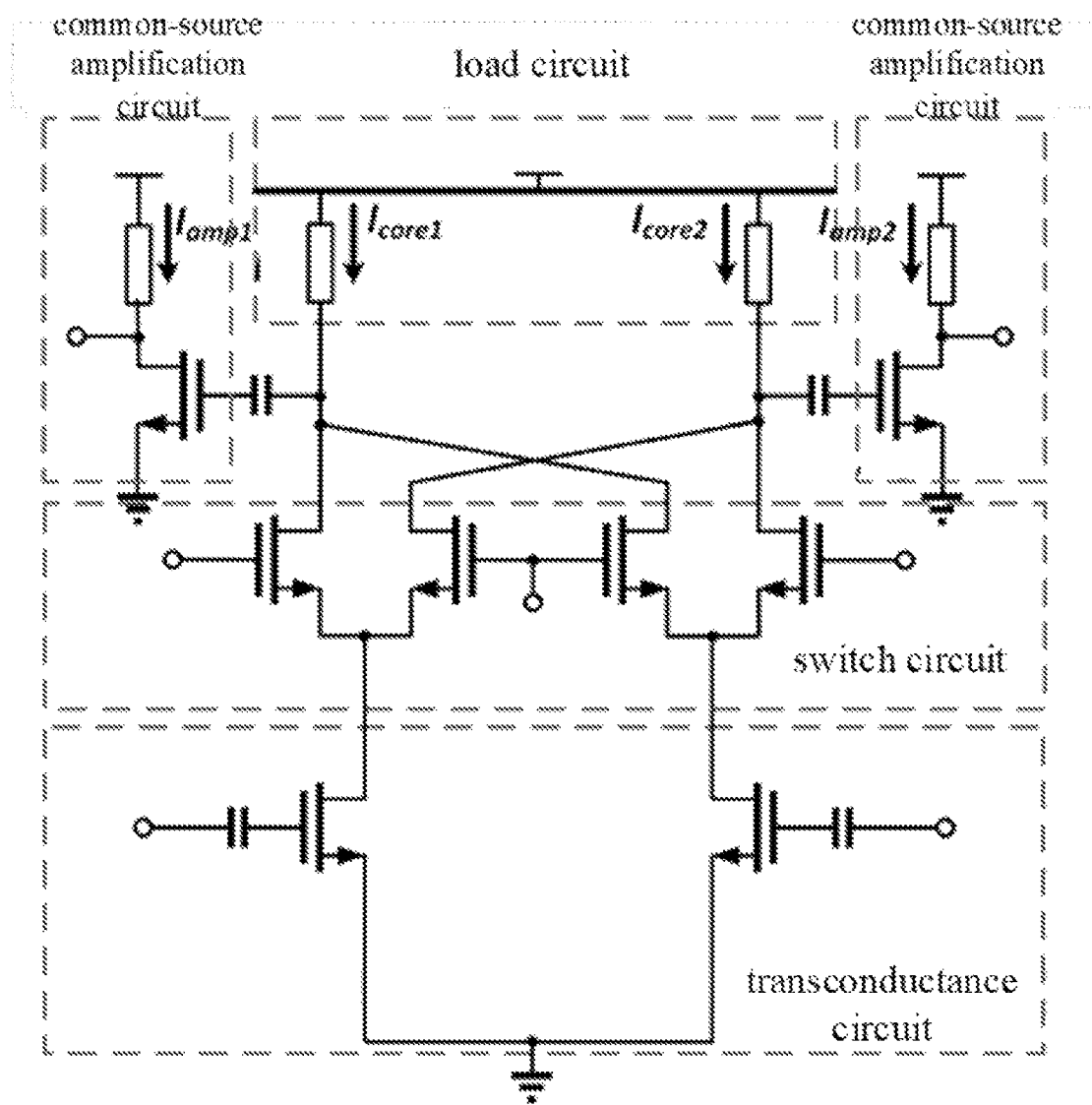
FIG. 1 is a circuit diagram of a frequency mixer in some related technologies.

In order to enable those of ordinary skill in the art to better understand the technical solutions of the present disclosure, a frequency mixer and a transceiver provided by the implementations of the present disclosure are described in detail below with reference to the drawings.

The present disclosure will be described more fully below with reference to the drawings, but the implementations illustrated may be embodied in different forms, and the present disclosure should not be interpreted as being limited to the implementations described below. Rather, the implementations are provided to make the present disclosure thorough and complete, and are intended to enable those of ordinary skill in the art to fully understand the scope of the present disclosure.

The drawings for the implementations of the present disclosure are intended to provide a further understanding of the implementations of the present disclosure and constitute a part of the specification. Together with specific implementations, the drawings are used to explain the present disclosure, but do not constitute any limitation to the present disclosure. The above and other features and advantages will become more apparent to those of ordinary skill in the art from the description of the specific implementations with reference to the drawings.

All the implementations of the present disclosure and the features therein may be combined with each other if no conflict is incurred.

The terms used herein are merely used to describe the specific implementations, and are not intended to limit the present disclosure. The term "and/or" used herein includes one associated listed item or any and all combinations of more than one associated listed items. The terms "a" and "the" used herein which indicate a singular form are intended to include a plural form, unless expressly stated in the context. The terms "include" and "be made of" used herein indicate the presence of the described features, integers, operations, elements and/or components, but do not exclude the presence or addition of one or more other features, integers, operations, elements, components and/or combinations thereof.

Unless otherwise defined, all terms (including technical and scientific terms) used herein have the same meaning as commonly understood by those of ordinary skill in the art. It should be further understood that terms, such as those defined in commonly used dictionaries, should be interpreted as having a meaning that is consistent with a meaning in the context of the related technology and the background of the present disclosure, and should not be interpreted in an idealized or overly formal sense unless expressly so defined herein With the development of mobile communication technology (such as the fifth-generation mobile communication technology (5G)), higher requirements are proposed on rate, latency and reliability of information transmission, and beam forming and Massive MIMO are two important techniques for meeting the requirements.

Both of the above two techniques need to integrate a large-scale front-end antenna array into a transceiver, which proposes a very high requirement on linearity of a frequency mixer in the transceiver; and meanwhile, since power consumption of the transceiver can directly affect battery life and use cost, it is also desirable to reduce the power consumption as much as possible while high linearity is ensured.

However, the power consumption of existing transceivers cannot meet the requirement.

A circuit diagram of a frequency mixer (an active double-balanced Gilbert mixer) according to some related technologies is shown in FIG. 1, and the frequency mixer mainly includes a transconductance circuit (transconductance-stage), a switch circuit (switch-stage), a load circuit (load-stage), and an amplification circuit (amplification-stage) connected to an interconnection point of the load circuit and the switch circuit.

Figure 2:
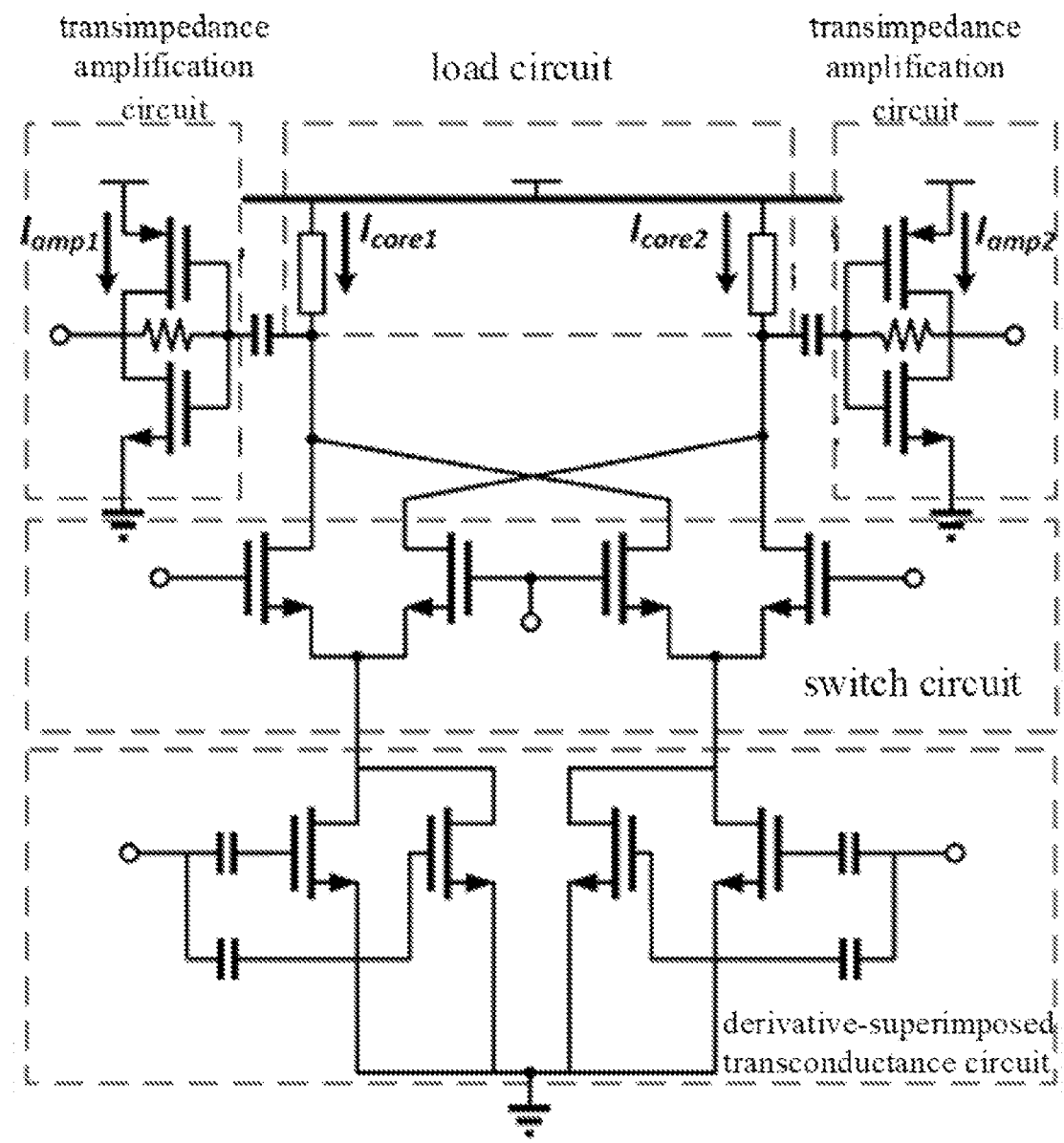
FIG. 2 is a circuit diagram of another frequency mixer in some related technologies.

Exemplarily, the transconductance circuit may be a common-source transconductance circuit, and the amplification circuit may be an intermediate-frequency amplification circuit, such as an intermediate-frequency common-source amplification circuit (see FIG. 1) or an intermediate-frequency transimpedance amplification circuit (see FIG. 2).

However, the active double-balanced Gilbert mixer has the following problems: the amplification circuit and the other part of the frequency mixer (a core of the frequency mixer) have their respective currents $I_{amp}$ (i.e., $I_{amp1}+I_{amp2}$ in the drawings) and $I_{core}$ (i.e., $I_{core1}+I_{core2}$ in the drawings), so a total current $I_{total}$ in the frequency mixer satisfies $I_{total}=I_{core}+I_{amp}$, that is, the amplification circuit and the other part of the frequency mixer have their respective power consumption, resulting in relatively high overall power consumption of the frequency mixer.

In order to improve linearity of the active double-balanced Gilbert mixer, as shown in FIG. 2, a derivative-superimposed transconductance circuit may be adopted, but the power consumption of the frequency mixer is still high.

Figure 3:
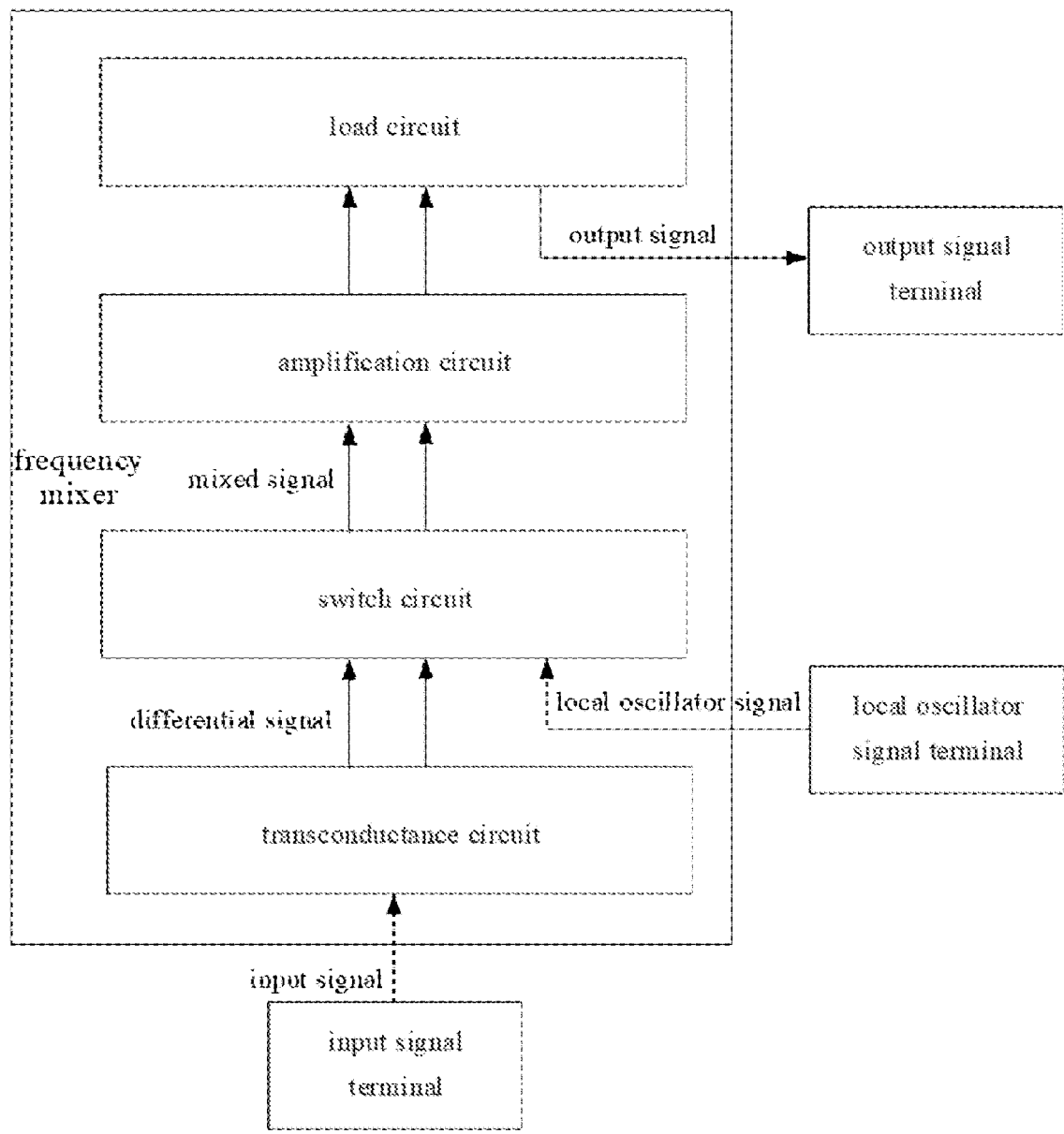
FIG. 3 is a block diagram of a frequency mixer according to the present disclosure.
Figure 4:
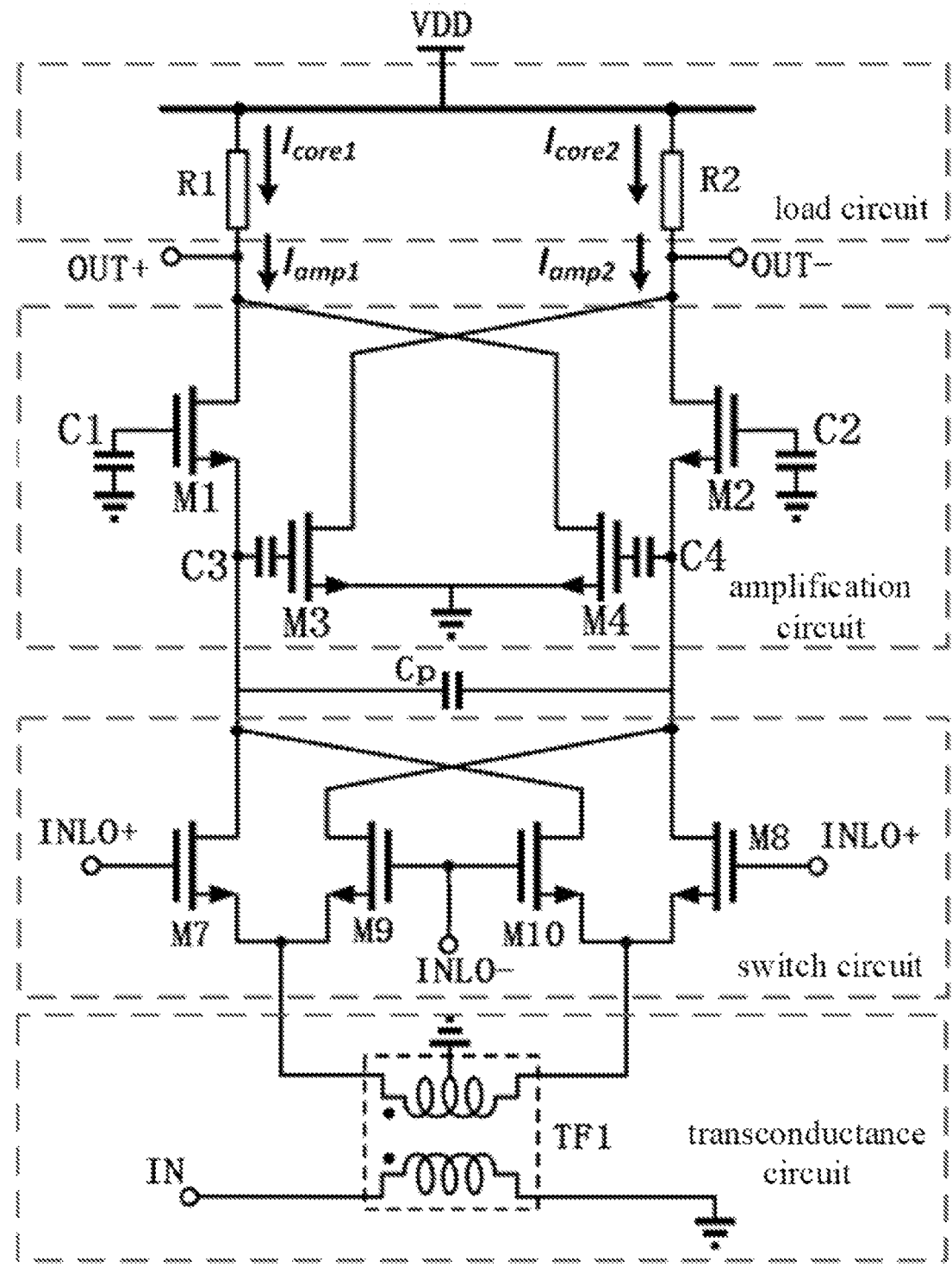
FIG. 4 is a circuit diagram of a frequency mixer according to the present disclosure.
Figure 5:
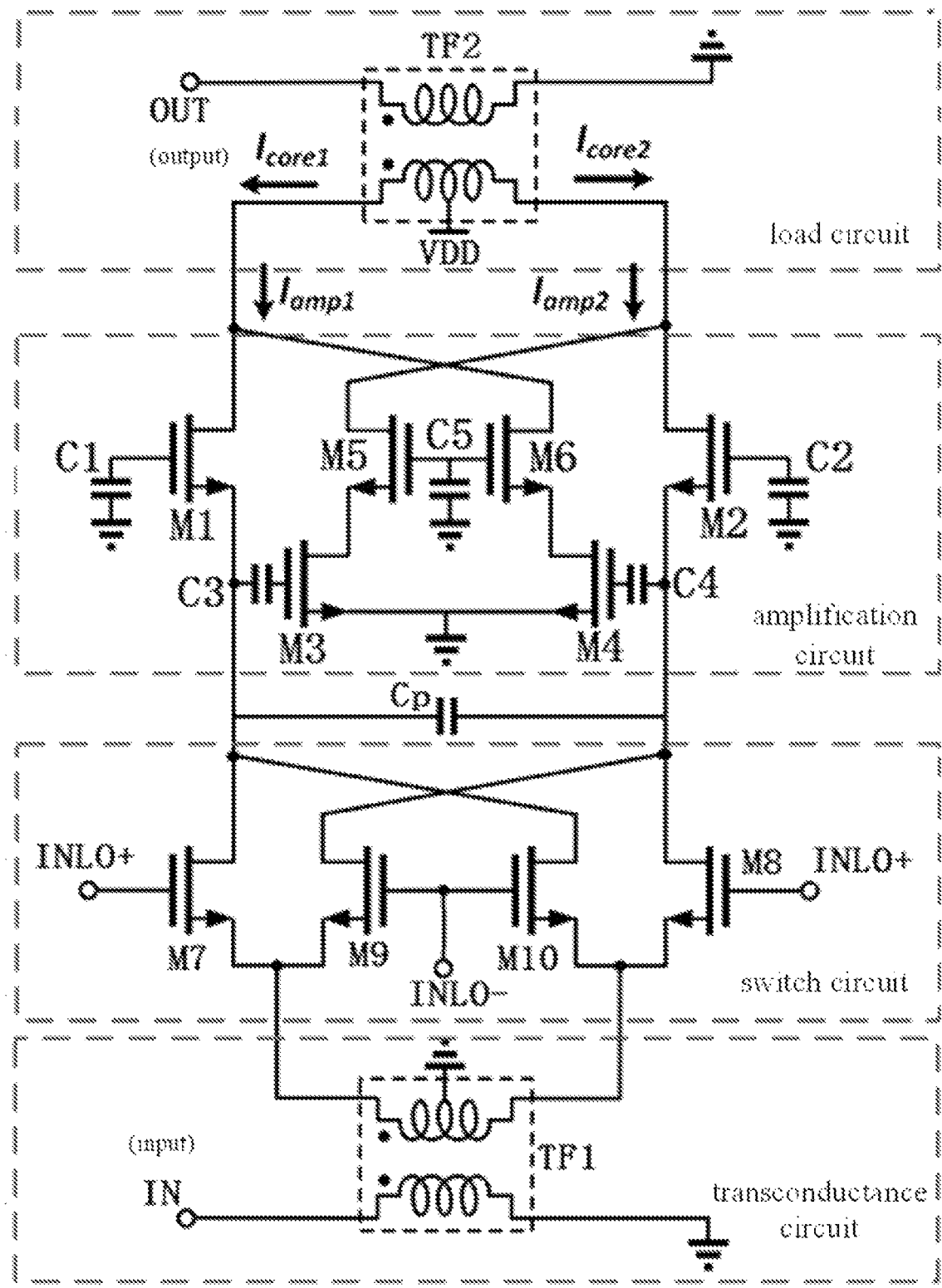
FIG. 5 is another circuit diagram of a frequency mixer according to the present disclosure.

In a first aspect, referring to FIG. 3 to FIG. 5, the present disclosure provides a frequency mixer.

The frequency mixer of the present disclosure is configured to perform frequency mixing on an input signal and a local oscillator signal, and is applicable to a transceiver such as a communication transceiver (e.g., a radio-frequency/millimeter-wave communication transceiver or a terahertz-band communication transceiver) or a radar transceiver.

For example, the frequency mixer may be used in a millimeter-wave transceiver, so that the frequency mixer can generate, according to a radio-frequency input signal and a local oscillator signal, an intermediate-frequency baseband signal having a frequency equal to a difference between a frequency of the input signal and a frequency of the local oscillator signal. Illustratively, the frequency of the input signal of the frequency mixer may be 26 GHz, and the frequency of the local oscillator signal may be 22 GHz, then the frequency of the intermediate-frequency signal (the baseband signal) generated according to the two signals is 4 GHz.

The frequency mixer of the present disclosure may be implemented in various ways, for example, the frequency mixer may be provided in a chip (IC) of an integrated circuit, or be provided on a conventional Printed Circuit Board (PCB), or be formed by a combination of physical components.

Referring to FIG. 3, in some implementations, the frequency mixer of the present disclosure includes: a transconductance circuit (transconductance-stage), which is connected to an input signal terminal IN, and configured to generate a differential signal according to an input signal from the input signal terminal IN and output the differential signal through a first output terminal (a left terminal thereof in FIG. 3) and a second output terminal (a right terminal thereof in FIG. 3) of the transconductance circuit; a switch circuit (switch-stage), which is connected to a local oscillator signal terminal and the first and second output terminals of the transconductance circuit, and configured to perform frequency mixing on a local oscillator signal from the local oscillator signal terminal and the differential signal to generate a mixed signal and output the mixed signal through a first output terminal (a left terminal thereof in FIG. 3) and a second output terminal (a right terminal thereof in FIG. 3) of the switch circuit; a load circuit (load-stage) connected to an output signal terminal OUT and configured to provide a load; and an amplification circuit (amplification-stage) connected between the switch circuit and the load circuit and configured to amplify the mixed signal.

In the frequency mixer of the present disclosure, the input signal (e.g., a radio frequency signal) input from the input signal terminal IN is first converted into the differential signal by the transconductance circuit, and then subjected to the frequency mixing (e.g., frequency subtraction) with the local oscillator signal (e.g., a radio frequency signal) input from the local oscillator signal terminal in the switch circuit to obtain the mixed signal (e.g., an intermediate-frequency signal), and the mixed signal is then injected into the amplification circuit (e.g., an intermediate-frequency amplification circuit) to be amplified, and the amplified mixed signal is finally output by the load circuit through the output signal terminal OUT.

In the frequency mixer of the present disclosure, the amplification circuit (the intermediate-frequency amplification circuit) is not cascaded after the load circuit and the other part (the core of the frequency mixer) of the frequency mixer, but is "inserted" between the load circuit and the switch circuit, so that the amplification circuit and the other part of the frequency mixer are in a "current-multiplexing" mode, i.e., sharing one current ($I_{total}=I_{core}=I_{amp}$); and therefore, the amplification circuit actually does not occupy an extra current, which greatly reduces the overall power consumption of the frequency mixer, prolongs the battery life, and reduces the use cost.

In some implementations, the transconductance circuit includes a first transformer TF1.

In some implementations, the first transformer TF1 includes: a first primary coil having a first end connected to the input signal terminal IN and a second end connected to a grounding terminal; and a first secondary coil having a first end and a second end respectively connected to the first output terminal and the second output terminal of the transconductance circuit, and a middle tap connected to the grounding terminal.

Referring to FIG. 4 and FIG. 5, the transformer (the first transformer TF1) may be used as the transconductance circuit in the present disclosure. Apparently, the transformer belongs to a passive device, so the corresponding transconductance circuit is a passive transconductance circuit.

Furthermore, the primary coil (the first primary coil) of the first transformer TF1 may be directly connected between the input signal terminal IN and the grounding terminal. The secondary coil (the first secondary coil) is connected between the two output terminals of the transconductance circuit, and further has the middle tap connected to the grounding terminal. Thus, the first secondary coil can provide a direct current path needed for operation of the entire frequency mixer.

Referring to FIG. 1 and FIG. 2, in the frequency mixers according to some related technologies, both the transconductance circuit and the amplification circuit may actually affect linearity, resulting in relatively low overall linearity of the frequency mixers.

However, in the frequency mixer of the present disclosure, the passive transformer (the first transformer TF1) is directly used as the transconductance circuit, which avoids nonlinear distortion and ensures linearity of the transconductance circuit, thereby improving the overall linearity of the frequency mixer.

In addition, by reasonably designing parameters of the first primary coil and the first secondary coil, such as size, the number of turns, and coupling coefficient, an impedance match of the input signal terminal IN (e.g., a radio frequency port) can be easily realized, and the transformer can convert a single-ended input signal (e.g., a radio frequency signal) into a differential signal and suppress an even-order cross-modulation component in the circuit.

In the present disclosure, the switch circuit and the corresponding local oscillator signal terminal may be in various forms.

For example, referring to FIG. 4 and FIG. 5, the switch circuit may adopt a Gilbert cell. The Gilbert cell includes a seventh transistor device M7, an eighth transistor device M8, a ninth transistor device M9, and a tenth transistor device M10. Gate electrodes of the seventh transistor device M7 and the eighth transistor device M8 are connected to a first local oscillator signal terminal INLO+(e.g., a positive terminal of the local oscillator signal), source electrodes of the seventh transistor device M7 and the eighth transistor device M8 are respectively connected to the two output terminals of the transconductance circuit, and drain electrodes of the seventh transistor device M7 and the eighth transistor device M8 are respectively connected to the two output terminals of the switch circuit. Gate electrodes of the ninth transistor device M9 and the tenth transistor device M10 are both connected to a second local oscillator signal terminal INLO− (e.g., a negative terminal of the local oscillator signal), source electrodes of the ninth transistor device M9 and the tenth transistor device M10 are respectively connected to the two output terminals of the transconductance circuit (that is, respectively connected to the source electrode of the seventh transistor device M7 and the source electrode of the eighth transistor device M8), and a drain electrode of the ninth transistor device M9 and a drain electrode of the tenth transistor device M10 intersect and are then respectively connected to the two output terminals of the switch circuit (i.e., respectively connected to the drain electrode of the eighth transistor device M8 and the drain electrode of the seventh transistor device M7).

The seventh transistor device M7, the eighth transistor device M8, the ninth transistor device M9, and the tenth transistor device M10 have same dimensions such as width-to-length ratio, and are all biased in a weak inversion region. Thus, a noise coefficient in the frequency mixing process can be effectively reduced, the linearity can be improved, a leakage of the local oscillator signal can be reduced, and a local-oscillation even-order harmonic component can be suppressed.

In some implementations, the frequency mixer further includes: a filter capacitor Cp having a first electrode connected to the first output terminal of the switch circuit and a second electrode connected to the second output terminal of the switch circuit.

Referring to FIG. 4 and FIG. 5, the filter capacitor Cp may be connected in parallel between the two output terminals of the switch circuit (also between the two input terminals of the amplification circuit) to filter out harmonics (e.g., high-frequency harmonics) from the mixed signal generated by the switch circuit and filter out spurs (e.g., high-frequency spurs) generated due to the frequency mixing process, and then the filtered mixed signal is input to the amplification circuit to further improve the linearity.

In some implementations, the amplification circuit includes: a common-gate path including a first transistor device M1 and a second transistor device M2 having gate electrodes thereof coupled to each other; the first transistor device M1 has a source electrode connected to the first output terminal of the switch circuit, and a drain electrode connected to the first output terminal (the left terminal in the drawings) of the amplification circuit; and the second transistor device M2 has a source electrode connected to the second output terminal of the switch circuit, and a drain electrode connected to the second output terminal (the right terminal in the drawings) of the amplification circuit. The amplification circuit further includes: a common-source path including a third transistor device M3 and a fourth transistor device M4 having source electrodes thereof coupled to each other; the third transistor device M3 has a gate electrode coupled to the first output terminal of the switch circuit, and a drain electrode coupled to the second output terminal of the amplification circuit; and the fourth transistor device M4 has a gate electrode coupled to the second output terminal of the switch circuit, and a drain electrode coupled to the first output terminal of the amplification circuit. Here, the common-gate path refers to a circuit adopting a common-gate structure; and similarly, the common-source path refers to a circuit adopting a common-source structure.

In some implementations, the gate electrode of the first transistor device M1 is connected to a first electrode of a first capacitor C1; the gate electrode of the second transistor device M2 is connected to a first electrode of a second capacitor C2; a second electrode of the first capacitor C1 and a second electrode of the second capacitor C2 are both connected to the grounding terminal; the source electrode of the third transistor device M3 and the source electrode of the fourth transistor device M4 are both connected to the grounding terminal; the gate electrode of the third transistor device M3 is connected to a first electrode of a third capacitor C3, and a second electrode of the third capacitor C3 is connected to the first output terminal of the switch circuit; and the gate electrode of the fourth transistor device M4 is connected to a first electrode of a fourth capacitor C4, and a second electrode of the fourth capacitor C4 is connected to the second output terminal of the switch circuit.

In the implementations of the present disclosure, the "coupling" of two structures refers to that the two structures are electrically connected to each other, other devices may be further provided on a lead between the two structures, or the two structures may be electrically connected to a same signal source.

In the implementations of the present disclosure, the "connection" of two structures refers to that the two structures are directly connected to each other through a lead, with no other devices than the lead disposed therebetween, that is, electrical signals in the two structures are theoretically equal to each other at any time.

In the implementations of the present disclosure, the "transistor device" refers to one element or a combination of a plurality of elements, with the one element or the combination being electrically equivalent to a transistor (i.e., being capable of performing functions of a transistor).

In some implementations, the transistor device is a field effect transistor or a triode.

Illustratively, the transistor device may be in the form of a field effect transistor (e.g., a Metal-Oxide-Semiconductor (MOS) field effect transistor) or a triode (e.g., a bipolar transistor). For example, an N-type field effect transistor (e.g., an NMOS field effect transistor) may be replaced with an NPN triode, and a P-type field effect transistor (e.g., a PMOS field effect transistor) may be replaced with a PNP triode.

Referring to FIG. 4, illustratively, in the frequency mixer of the present disclosure, the amplification circuit may include the common-gate path and the common-source path; the common-gate path includes the transistor devices having the gate electrodes thereof coupled to each other; and the common-source path includes the transistor devices having the source electrodes thereof coupled to each other and having the drain electrodes thereof respectively connected to the two output terminals of the amplification circuit.

Referring to FIG. 1 and FIG. 2, in the frequency mixers according to some related technologies, no matter the intermediate-frequency transimpedance amplification circuit or the intermediate-frequency common-source amplification circuit is adopted, input impedance in an intermediate frequency band is relatively large, which may cause a mismatch of cascade impedance of the core of the frequency mixer, and the mismatch of cascade impedance may further cause a relatively large loss; and in order to compensate for the loss, a gain of the amplification circuit needs to be increased, which further increases the power consumption of the amplification circuit.

In the present disclosure, an impedance match between the amplification circuit and the switch circuit can be easily realized through the common-gate path, so that a loss of cascade connection can be reduced, and the extra power consumption caused by the compensation for the loss caused by the impedance mismatch can be avoided.

Moreover, by adopting the amplification circuit having the two-path (the common-gate path and the common-source path) structure, three-order nonlinear transconductance with opposite polarities and same amplitude of the two paths can be realized by adjusting properties (such as bias voltage and width-to-length ratio) of at least four transistor devices in the two paths, so that cancellation of three-order transconductance can be realized at a composite node of the two paths, and the linearity of the amplification circuit can be improved.

Further, since first-order transconductance of the two paths has the same polarity, the two-path structure can further provide a relatively large intermediate-frequency gain to realize sufficient amplitude amplification.

Thus, by adopting the frequency mixer including the common-gate path and the common-source path, the power consumption of the frequency mixer can be further reduced, and the linearity of the frequency mixer can be improved.

In some implementations, the common-source path is a common-source and common-gate path; and the common-source and common-gate path further includes a fifth transistor device M5 and a sixth transistor device M6 having gate electrodes thereof coupled to each other. The drain electrode of the third transistor device M3 is coupled to the second output terminal of the amplification circuit through the fifth transistor device M5, and the drain electrode of the fourth transistor device M4 is coupled to the first output terminal of the amplification circuit through the sixth transistor device M6.

In some implementations, the gate electrodes of the fifth transistor device M5 and the sixth transistor device M6 are both connected to a first electrode of a fifth capacitor C5, and a second electrode of the fifth capacitor C5 is connected to the grounding terminal.

Referring to FIG. 5, the common-source path in the amplification circuit of the frequency mixer may further be the common-source and common-gate path, that is, the common-source path further includes the two transistor devices (the fifth transistor device M5 and the sixth transistor device M6) having the gate electrodes thereof coupled to each other, and the gate electrodes of the two transistor devices (the third transistor device M3 and the fourth transistor device M4), the source electrodes of which are coupled to each other, are respectively connected to the two output terminals of the amplification circuit through the two transistor devices (the fifth transistor device M5 and the sixth transistor device M6).

Illustratively, referring to FIG. 5, in the amplification circuit of the frequency mixer, the common-gate path includes the first transistor device M1 and the second transistor device M2, the gate electrodes of the first transistor device M1 and the second transistor device M2 are grounded through the first capacitor C1 and the second capacitor C2 respectively, the source electrodes of the first transistor device M1 and the second transistor device M2 are respectively connected to the two output terminals of the switch circuit, and the drain electrodes of the first transistor device M1 and the second transistor device M2 are respectively connected to the two output terminals of the amplification circuit. The first capacitor C1 and the second capacitor C2 are equivalent to supplying an alternating current (AC) ground to the gate electrodes of the first transistor device M1 and the second transistor device M2, which can increase the gain.

The common-source and common-gate path includes the third transistor device M3 and the fourth transistor device M4 having the source electrodes thereof coupled to each other, and the fifth transistor device M5 and the sixth transistor device M6 having the gate electrodes thereof coupled to each other. The source electrodes of the third transistor device M3 and the fourth transistor device M4 are both grounded, the gate electrodes of the third transistor device M3 and the fourth transistor device M4 are connected to the two output terminals of the switch circuit through the third capacitor C3 and the fourth capacitor C4 respectively, and the third capacitor C3 and the fourth capacitor C4 may perform a direct current-blocking function. The drain electrodes of the third transistor device M3 and the fourth transistor device M4 are connected to the two output terminals of the amplification circuit (the drain electrode of the third transistor device M3 is connected to the second output terminal, and the drain electrode of the fourth transistor device M4 is connected to the first output terminal) through (or through series connection with) the fifth transistor device M5 and the sixth transistor device M6 respectively, and the gate electrodes of the fifth transistor device M5 and the sixth transistor device M6 are grounded through the fifth capacitor C5. The fifth capacitor C5 is also configured to supply an AC ground to the gate electrode of the fifth transistor device M5, which can also increase the gain.

In some implementations, the load circuit includes an inductive load.

In some implementations, the inductive load is a second transformer TF2 and/or an inductor.

Referring to FIG. 5, the load circuit in the frequency mixer of the present disclosure may be a load having an "inductive property", such as the transformer (the second transformer TF2), and the inductor.

Since each inductive load corresponds to merely one output signal terminal OUT, referring to FIG. 5, the inductive load needs to be respectively connected to the two output terminals of the amplification circuit, and also connected to the output signal terminal OUT and the grounding terminal.

For example, in a case where the inductive load is the second transformer TF2, two ends of a primary coil (a second primary coil) of the second transformer TF2 may be respectively connected to the two output terminals of the amplification circuit, and a middle tap of the primary coil may be connected to a high-level terminal VDD; and two ends of a secondary coil (a second secondary coil) of the second transformer TF2 may be respectively connected to the output signal terminal OUT and the grounding terminal.

Referring to FIG. 1 and FIG. 2, in some related technologies, since the amplification circuit is divided into two parts, if the inductive load is adopted, each part of the amplification circuit needs an independent inductive load, that is, the whole frequency mixer needs to be provided with two inductive loads that occupy relatively large space, resulting in an increase in a size of the frequency mixer (e.g., an increase in a size of a chip provided with the frequency mixer).

However, referring to FIG. 5, in the implementations of the present disclosure, since the amplification circuit is a whole part located between the load circuit and the switch circuit, if the inductive load is adopted in the load circuit, merely one inductive load is enough, which can reduce the size of the frequency mixer (e.g., the size of the chip provided with the frequency mixer).

Apparently, referring to FIG. 4, the load circuit may include a load of any other type, such as a resistive load, a parallel LRC (inductance-resistance-capacitance) load or an active load, and the load circuit is not limited to including the inductive load.

When the load circuit is in different forms, positions and the number of output signal terminals OUT may vary correspondingly. For example, referring to FIG. 4, in a case where the load circuit includes a first resistor R1 and a second resistor R2, the two resistors may be respectively connected between the high-level terminal VDD and the two output terminals of the amplification circuit, and the two output terminals of the amplification circuit are also respectively connected to two output signal terminals, i.e., a first output signal terminal OUT+(a positive terminal of the output signal) and a second output signal terminal OUT−(a negative terminal of the output signal).

For illustrating an effect of the frequency mixer of the present disclosure, the frequency mixers in FIG. 1 and FIG. 2 according to the related technologies, and the frequency mixer in FIG. 5 according to the implementations of the present disclosure are fabricated, absolute power of output 1 dB compression point (representing the linearity of the frequency mixer, in the unit of decibel-milliwatt (dBm)) under the power consumption of 23 mW of the fabricated frequency mixers are measured, and power consumption under the same output 1 dB compression point (2 dBm) (representing the power consumption of the frequency mixer, in the unit of milliwatt) of the fabricated frequency mixers are also measured. The results are shown in Table 1 below.

TABLE 1

Results of Performance Tests of Different Frequency Mixers

| | frequency mixer in FIG. 1 | frequency mixer in FIG. 2 | frequency mixer in FIG. 5 |
|---|---|---|---|
| OP1dB (dBm) under power consumption = 23 mW | −2.5 | 2 | 8.3 |
| power consumption (mW) under OP1dB = 2 dBm | 32.5 | 23 | 6 |

As can be seen from Table 1, under the same power consumption, the linearity of the frequency mixer according to the implementations of the present disclosure is significantly better than that of the frequency mixers according to the related technologies (improved by more than 6 dB); and under the condition that the same output 1 dB compression point is achieved, the power consumption of the frequency mixer according to the implementations of the present disclosure is much lower than that of the frequency mixers according to the related technologies (reduced by 74% relative to the frequency mixer adopting the derivative-superimposed transconductance circuit, and reduced by 81.5% relative to the active double-balanced Gilbert mixer).

Thus, it can be demonstrated that the frequency mixer according to the implementations of the present disclosure can greatly improve the linearity of the output signal while greatly reducing the power consumption, so that the battery life can be prolonged, and the use cost can be reduced. In addition, in a case where the inductive load is adopted, the size of the frequency mixer (e.g., the size of the chip provided with the frequency mixer) according to the implementations of the present disclosure can be further reduced.

Figure 6:
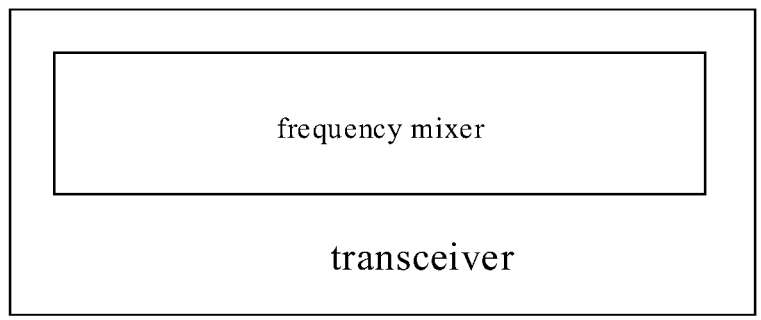
FIG. 6 is a block diagram of a transceiver according to the present disclosure.

In a second aspect, referring to FIG. 6, the present disclosure provides a transceiver, which includes: the above-described frequency mixer.

The transceiver of the present disclosure includes the above frequency mixer, so that the transceiver has high linearity, low power consumption, and small size.

In some implementations, the transceiver is a communication transceiver or a radar transceiver.

Illustratively, the transceiver may be in the form of the communication transceiver (e.g., a radio-frequency/millimeter-wave communication transceiver or a terahertz-band communication transceiver) or the radar transceiver.

Apparently, it is feasible that the transceiver is a transceiver used in other systems, or the frequency mixer is used in other systems.

The present disclosure discloses the exemplary implementations using specific terms, but the terms are merely used and should be merely interpreted as having general illustrative meanings, rather than for the purpose of limitation. Unless expressly stated, it is apparent to those of ordinary skill in the art that features, characteristics and/or elements described in connection with a particular implementation can be used alone or in combination with features, characteristics and/or elements described in connection with other implementations. Therefore, it should be understood by those of ordinary skill in the art that various changes in the forms and the details can be made without departing from the scope of the present disclosure of the appended claims.

What is claimed is:
1. A frequency mixer, comprising:
   a transconductance circuit connected to an input signal terminal, and configured to generate a differential sig- nal according to an input signal from the input signal terminal and output the differential signal through a first output terminal and a second output terminal of the transconductance circuit;

a switch circuit connected to a local oscillator signal terminal and the first output terminal and the second output terminal of the transconductance circuit, and configured to perform frequency mixing on a local oscillator signal from the local oscillator signal terminal and the differential signal to generate a mixed signal and output the mixed signal through a first output terminal and a second output terminal of the switch circuit;

a load circuit connected to an output signal terminal and configured to provide a load; and an amplification circuit connected between the switch circuit and the load circuit and configured to amplify the mixed signal, wherein the amplification circuit comprises:

a common-gate path comprising a first transistor device and a second transistor device having gate electrodes thereof coupled to each other; wherein the first transistor device has a source electrode connected to the first output terminal of the switch circuit, and a drain electrode connected to the first output terminal of the amplification circuit; and the second transistor device has a source electrode connected to the second output terminal of the switch circuit, and a drain electrode connected to the second output terminal of the amplification circuit; and a common-source path comprising a third transistor device and a fourth transistor device having source electrodes thereof coupled to each other; wherein the third transistor device has a gate electrode coupled to the first output terminal of the switch circuit, and a drain electrode coupled to the second output terminal of the amplification circuit; and the fourth transistor device has a gate electrode coupled to the second output terminal of the switch circuit, and a drain electrode coupled to the first output terminal of the amplification circuit.

2. The frequency mixer of claim 1, wherein the transconductance circuit comprises a first transformer.

3. The frequency mixer of claim 2, wherein the first transformer comprises:

a first primary coil having a first end connected to the input signal terminal and a second end connected to a grounding terminal; and a first secondary coil having a first end and a second end respectively connected to the first output terminal and the second output terminal of the transconductance circuit, and a middle tap connected to the grounding terminal.

4. The frequency mixer of claim 1, wherein a gate electrode of the first transistor device is connected to a first electrode of a first capacitor; a gate electrode of the second transistor device is connected to a first electrode of a second capacitor; and a second electrode of the first capacitor and a second electrode of the second capacitor are both connected to a grounding terminal; and a source electrode of the third transistor device and a source electrode of the fourth transistor device are both connected to the grounding terminal; the gate electrode of the third transistor device is connected to a first electrode of a third capacitor, and a second electrode of the third capacitor is connected to the first output terminal of the switch circuit; and the gate electrode of the fourth transistor device is connected to a first electrode of a fourth capacitor, and a second electrode of the fourth capacitor is connected to the second output terminal of the switch circuit.

5. The frequency mixer of claim 4, wherein the common-source path is a common-source and common-gate path; and the common-source and common-gate path further comprises a fifth transistor device and a sixth transistor device having gate electrodes thereof coupled to each other; and the drain electrode of the third transistor device is coupled to the second output terminal of the amplification circuit through the fifth transistor device, and the drain electrode of the fourth transistor device is coupled to the first output terminal of the amplification circuit through the sixth transistor device.

6. The frequency mixer of claim 5, wherein the gate electrodes of the fifth transistor device and the sixth transistor device are both connected to a first electrode of a fifth capacitor, and a second electrode of the fifth capacitor is connected to the grounding terminal.

7. The frequency mixer of claim 6, wherein transistor devices are field effect transistors or triodes.

8. The frequency mixer of claim 5, wherein transistor devices are field effect transistors or triodes.

9. The frequency mixer of claim 1, wherein transistor devices are field effect transistors or triodes.

10. The frequency mixer of claim 1, wherein the load circuit comprises an inductive load.

11. The frequency mixer of claim 10, wherein the inductive load is a second transformer and/or an inductor.

12. The frequency mixer of claim 1, further comprising:

a filter capacitor having a first electrode connected to the first output terminal of the switch circuit and a second electrode connected to the second output terminal of the switch circuit.

13. A transceiver, comprising:
the frequency mixer of claim 12.

14. A transceiver, comprising:
the frequency mixer of claim 1.

15. The transceiver of claim 14, wherein the transceiver is a communication transceiver or a radar transceiver.

16. The transceiver of claim 14, wherein the transconductance circuit comprises a first transformer.

17. The transceiver of claim 16, wherein the first transformer comprises:

a first primary coil having a first end connected to the input signal terminal and a second end connected to a grounding terminal; and a first secondary coil having a first end and a second end respectively connected to the first output terminal and the second output terminal of the transconductance circuit, and a middle tap connected to the grounding terminal.

18. The transceiver of claim 14, wherein a gate electrode of the first transistor device is connected to a first electrode of a first capacitor; a gate electrode of the second transistor device is connected to a first electrode of a second capacitor; and a second electrode of the first capacitor and a second electrode of the second capacitor are both connected to a grounding terminal; and a source electrode of the third transistor device and a source electrode of the fourth transistor device are both connected to the grounding terminal; the gate electrode of the third transistor device is connected to a first electrode of a third capacitor, and a second electrode of the third capacitor is connected to the first output terminal of the switch circuit; and the gate electrode of the fourth transistor device is connected to a first electrode of a fourth capacitor, and a second electrode of the fourth capacitor is connected to the second output terminal of the switch circuit.

19. The frequency mixer of claim 4, wherein transistor devices are field effect transistors or triodes.

\* \* \* \* \*